United States Patent
Ozawa

(10) Patent No.: US 6,653,854 B2
(45) Date of Patent: Nov. 25, 2003

(54) TEST PIN UNIT

(75) Inventor: Akira Ozawa, Chiba (JP)

(73) Assignee: UMC Japan, Tateyama (JP)

( * ) Notice: Subject to any disclaimer, the term of this patent is extended or adjusted under 35 U.S.C. 154(b) by 0 days.

(21) Appl. No.: 10/234,341

(22) Filed: Sep. 5, 2002

(65) Prior Publication Data

US 2003/0048109 A1 Mar. 13, 2003

(30) Foreign Application Priority Data

Sep. 11, 2001 (JP) ........................................ 2001-274529

(51) Int. Cl.⁷ ............................................... G01R 31/02
(52) U.S. Cl. .................................................... 324/754
(58) Field of Search .......................... 324/72.5, 754, 324/758, 761, 762, 765, 158.1; 439/169, 174, 482, 912; 29/842, 874, 884

(56) References Cited

U.S. PATENT DOCUMENTS 3,345,567 A * 10/1967 Turner et al. ............... 324/762
3,551,807 A * 12/1970 Kulischenko et al. ...... 324/72.5
4,103,232 A *  7/1978 Sugita et al. ............... 324/754

* cited by examiner

*Primary Examiner*—Kamand Cuneo
*Assistant Examiner*—Minh N. Tang
(74) *Attorney, Agent, or Firm*—Crowell & Moring LLP

(57) ABSTRACT

A test pin unit that allows a test-pin replacement at a substantially low cost. The test pin unit has a coil spring, a movable member, a retaining member, and a test pin. The movable member is capable of moving within a predetermined distance along a predetermined reference axis. The coil spring forces the movable member toward the distal end of the predetermined reference axis. The retaining member retains the test pin substantially in parallel to the reference axis in a removable manner and is integrally mounted on the movable member. In addition, the retaining member has a housing part to hold a part of the test pin and at least one screw provided on the periphery of the housing part. The test pin is fixed on the housing part by housing the part of the test pin and then securing the part of the test pin on the housing part by the screw.

12 Claims, 1 Drawing Sheet

TEST PIN UNIT

BACKGROUND OF THE INVENTION

1. Field of the Invention

The present invention relates to a test pin unit to be used in test apparatus for carrying out a test on a subject to evaluate electric characteristics of the subject such as a semiconductor wafer or an electric circuit board of an electrical appliance.

2. Description of the Prior Art

Heretofore, test apparatus designed specifically for individual subjects such as semiconductor wafers and electric circuit boards of electrical appliances have been used for carrying out tests on these subjects to evaluate their electric characteristics, respectively. Generally, each test apparatus comprises a plurality of test pin units and a substrate. The pin unit has a test pin to be brought into contact with a predetermined test point (pad) of the subject. Such a conventional test pin is provided as a combination with a spring or the like wound around the test pin. Therefore, the test pin is spring-loaded by a spring tension. In addition, the substrate has a plurality of pores. Each of the test pin units is inserted into the pore. Furthermore each of the test pin units is connected to a lead wire.

For testing the electric characteristics of the subject, each of the test pins of the test apparatus is brought into contact with a test point of the subject. Then, the test apparatus is pressed against the subject while maintaining the contact between the test pin and the test point. In this case, the test pin can be in contact with the test point as the spring tension exerts a certain stylus force thereon. Subsequently, a certain electric signal is sent to each test pin through the lead wire to carry out a test on the subject to evaluate electric characteristics of the subject.

The tip of the test pin becomes deformed as the number of usages of the test pin increases. At the time of carrying out the test, therefore, there is a possibility of causing several problems such as the increase in contact resistance of the test pin to the test point of the subject and the generation of contact failure of the test pin to the test point of the subject. If one of such problems arises, there is a need to replace a wornout test pin with a new one. In this case, however, it is difficult to replace only the worn-out test pin with a new one because the conventional test pin is integrally constructed with a spring member. In other words, the whole of the test pin unit having the worn-out test pin should be junked and should be replaced with a new test pin unit. Consequently, the conventional test pin has a disadvantage of mounting costs at the time of test-pin replacement.

SUMMARY OF THE INVENTION

The present invention has been completed in view of the above disadvantage of the conventional test pin. Therefore, an object of the present invention is to provide a test pin unit that allows a test-pin replacement at a substantially low cost, compared with the conventional one.

For attaining the above object, there is provided a test pin unit to be used in a test apparatus for carrying out a test on a subject to evaluate electric characteristics of the subject such as a semiconductor wafer or an electric circuit board of an electrical appliance, having a test pin to be brought into contact with a predetermined test point on the subject, comprising: a movable member capable of moving within a predetermined distance along a predetermined reference axis; means for forcing the movable member toward the distal end of the predetermined reference axis; and a retaining member for retaining the test pin substantially parallel to the reference axis in a removable manner, where the retaining member is integrally mounted on the movable member.

Here, the retaining member may preferably comprise a housing part for housing a part of the test pin and at least one screw provided on the periphery of the housing part, where the test pin is fixed on the housing part by housing the part of the test pin and then securing the part of the test pin on the housing part by the screw.

The above and other objects, effects, features, and advantages of the present invention will become more apparent from the following embodiment thereof take in conjunction with the accompanying drawing.

DETAILED DESCRIPTION OF PREFERRED EMBODIMENTS

Figure 1:
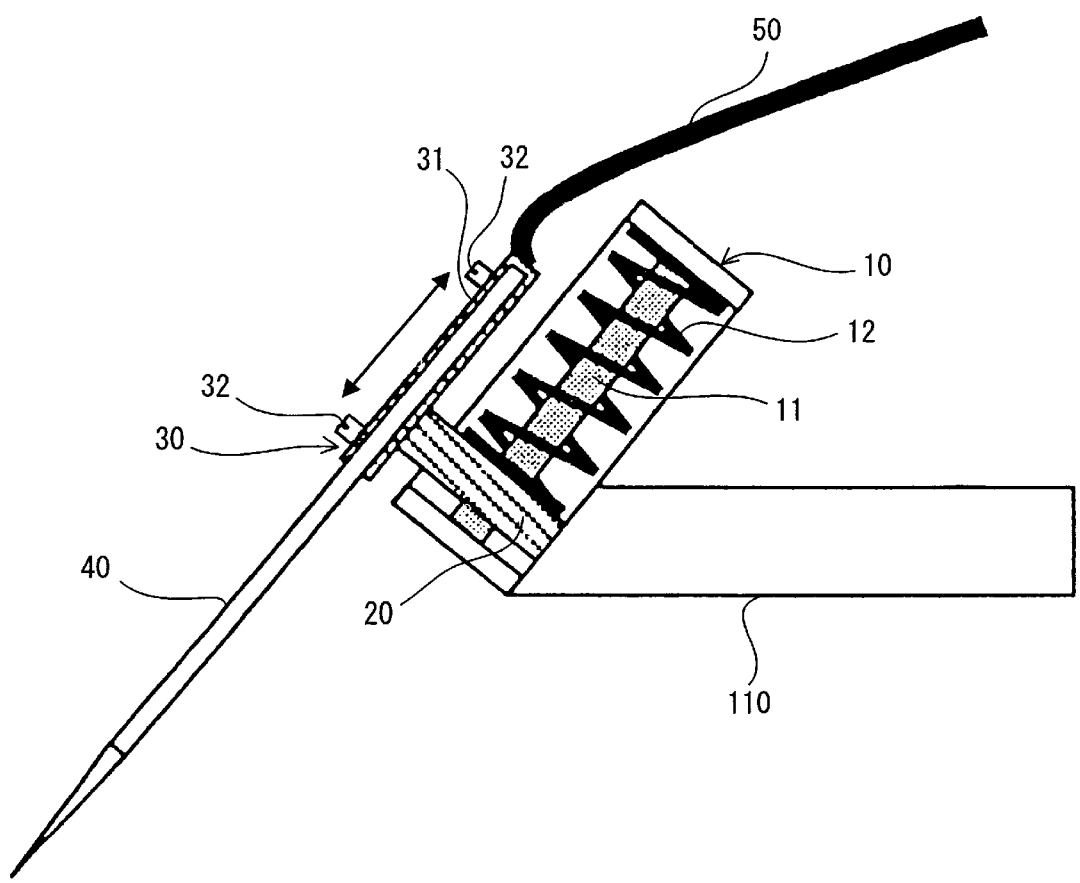
FIG. 1 is a schematic diagram of the test pin unit as one of the preferred embodiments of the present invention.

Hereinafter, we will describe the configuration of a test pin unit as one of preferred embodiments of the present invention with reference to the attached FIGURE.

Referring now to FIG. 1, there is shown a schematic diagram of the test pin unit as one of the preferred embodiments of the present invention.

The test pin unit of the present embodiment is specifically designed for carrying out a test on a subject to evaluate electric characteristics of a subject such as a semiconductor wafer or an electric circuit board of an electrical appliance. As shown in FIG. 1, the test pin unit comprises a spring cylinder part 10, a movable member 20, a retaining member 30, a substantially straight test pin 40, and a lead wire 50. The test pin 40 is provided as one having a sharp-pointed tip to be brought into contact with a predetermined test point (pad) of the subject at the time of a test. Here, the sharp-pointed tip of the test pin 40 is also referred to as the distal end of the test pin 40. In addition, the other end of the test pin 40 is referred to as the proximal end of the test pin 40. Similarly, in the figure, each structural component has its own distal and proximal ends.

A cylindrical member 11 is arranged in the inside of the spring cylinder part 10 so as to extend along the central axis (also referred to as a reference axis) of the spring cylinder part 10 or so as to be concentrically positioned with respect to each other. Here, the reference axis has a distal end in the direction facing to the subject and a proximal end in the direction opposite to the subject. In addition, there is a coil spring (i.e., forcing means) 12 wound around the cylindrical member 11. Furthermore, the movable member 20 is attached on the cylindrical member 11 such that it is capable of moving along the reference axis within a predetermined distance. As shown in the figure, a part of the movable member 20 is protruded outwardly from the periphery of the spring cylinder part 10 (i.e., protruded in the direction perpendicular to the central axis of the spring cylinder part 10). On the other hand, the remaining part of the movable member 20 is located in the inside of the spring cylinder part 10. In addition, the coil spring 12 is in a contracted state and is located behind the movable member 20 in the spring cylinder part 10 such that the movable member 20 is forced to move forward by spring tension of the coil spring 12. However, such a forward movement of the movable member 20 is restricted by a stopper (not shown) or the like.

The retaining member 30 retains the test pin 40 in a removable manner such that the test pin 40 extends in a direction parallel with the reference axis of the spring cylinder part 10. More specifically, the retaining member 30 comprises a housing part 31 for housing a part of the test pin 40 and two screws 32 provided on the periphery of the housing part 31. Here, the central axis of the housing part 31 and the central axis (i.e., reference axis) of the spring cylinder part 10 are substantially parallel to each other but do not coincide with each other. In addition, the number of screws 32 is not limited to two.

In this embodiment, each of the screws 32 may be a fastening screw. In this case, the test pin 40 is housed in the housing part 31 and is then secured therein by the fastening screw 32. Alternatively, the screw 32 may be a male screw while a corresponding female screw may be formed in a predetermined position on the test pin 40. In this case, the test pin 40 is housed in the housing part 31 and is then secured by screwing the male screw 32 into the female screw. Therefore, the test pin 40 can be easily fixed in the retaining member 30 by fastening the screw 32, while it can be easily removed from the retaining member 30 by unfastening the screw 32.

As described above, the retaining member 30 is integrally mounted on the side surface of the movable member 20. Therefore, the retaining member 30 and the movable member 20 are capable of moving back and forth together in the direction along the arrow shown in FIG. 1. When the tip of the test pin 40 being held by the retaining member 30 is pressed, the test pin 40, the retaining member 30, and the movable member 20 move backward together against the tension of the coil spring 12 in the spring cylinder part 10. In other words, the test pin 40 is spring-loaded by the coil spring 12 through the retaining member 30 and the movable member 20, so that the test pin 40 exerts force against the pressure being applied on the tip of the test pin 40.

As shown in the figure, there is a lead wire 50 attached on the bottom end of the housing part 31. When the test pin 40 is housed in the housing part 31, the test pin 40 is allowed to make an electrical connection with the lead wire 50. The other end of the lead wire 50 is connected to an electrical signal generator (not shown).

Then, a plurality of the test pin units constructed as described above is attached on a spring-cylinder anchoring seat (base plate) 110 to provide a test apparatus specifically designed for carrying out a test on the subject with respect to its electric characteristics. In FIG. 1, the test pin unit is fixed on the spring-cylinder anchoring seat 110 such that the test pin unit is tilted at a predetermined angle with respect to the surface of the spring-cylinder anchoring-seat 110 in consideration of carrying out a test on a semiconductor wafer for evaluating the electric characteristics of the semiconductor wafer. In the case of evaluating the electric characteristics of an electric circuit board of an electric apparatus, for example, the test pin unit is perpendicularly mounted on the spring-cylinder anchoring seat 110 in general. Typically, such a spring-cylinder anchoring seat 110 is made of an acrylic resin board.

For carrying out a test on the subject for evaluating the electric characteristics of the subject, at first, each of the test pins 40 of the test apparatus is brought into contact with a test point (pad) of the subject and then the test apparatus is pressed against the subject in a manner that the test pin 40 is touching on the test point. Therefore, the test pin 40 is in contact with the test point of the subject with positive stylus force exerted by the tension of the coil spring 12.

Subsequently, a predetermined electric signal is transmitted to each test pin 40 through the respective lead wire 50 to carry out a test on the subject to evaluate the electric characteristics of the subject.

Furthermore, the tip of the test pin 40 becomes deformed or worn out as the number of usages of the test pin increases. At the time of carrying out the test, therefore, there is a possibility of causing several problems such as an increase in contact resistance of the test pin 40 to the test point of the subject and contact failure of the test pin 40 to the test point of the subject. If one of such problems arises, there is a need to replace the worn-out test pin with a new one. For countering such problems, in the configuration of the test pin unit of the present embodiment, a worn-out test pin can be removed from the retaining member 30 without removing other intact test pins and is then replaced with a new one. In other words, screws 32 on the retaining member 30 are unscrewed and thus the test pin 40 can be drawn out of the housing part 31. Therefore, the test pin 40 can be easily removed from the housing part 31. On the other hand, the test pin 40 is housed in the housing part 31 and screws 32 on the retaining member 30 are screwed. Therefore, the test pin 40 can be easily attached on the housing part 31, so that there is no need to replace the whole test pin unit with a new one at the time of replacing the worn-out test pin 40 with new one. According to the configuration of the conventional test pin unit, on the other hand, there is a need to replace the whole test pin unit with new one.

As described above, the test pin unit of the present embodiment is constructed to individually retain each test pin in a removable manner, so that the worn-out test pin can be replaced with a new one without removing other intact test pins. Therefore, there is no need to replace the whole test pin unit with a new one at the time of replacing the worn-out test pin 40 with a new one, allowing cost reduction at the time of test-pin replacement.

Furthermore, the present invention is not limited to the embodiment described above. Various modifications thereof can be possible within the gist of the present invention.

In the above embodiment, the test pin is not mounted in line with the central axis of the spring cylinder and they are on different planes. According to the present invention, however, the test pin unit may be alternatively configured such that the test pin can be mounted in line with the central axis of the spring cylinder part by concentrically mounting the retaining member on the front end of the movable member.

According to the present invention, as described above, the test pin unit comprises: a movable member capable of moving within a predetermined range along a predetermined reference axis; means for forcing a movable member toward the distal end of the predetermined reference axis; and a retaining member for retaining the test pin substantially in parallel to the reference axis in a removable manner, where the retaining member is integrally mounted on the movable member. Therefore, if one of the test pins deteriorates, the deteriorated test pin only can be removed from the retaining member to replace it with a new one without any difficulty. Therefore, there is no need to replace the whole test pin unit with a new one at the time of replacing the worn-out test pin 40 with a new one in contrast to the conventional test pin unit, so that a test-pin replacement can be performed at a substantially low cost compared with the conventional one.

The present invention has been described in detail with respect to one of preferred embodiments, and it will be obvious to those skilled in the art that changes and modifications may be made without departing from the invention in its broader aspects, and it is the intention, therefore, in the appended claims to cover all such changes and modifications as fall within the true sprint of the invention.

What is claimed is:

1. A test pin unit to be used in a test apparatus to test a subject to evaluate electric characteristics of the subject, said test pin unit comprising:
   a test pin to be brought into contact with a predetermined test point on the subject;
   a movable member capable of moving within a predetermined distance along a predetermined reference axis;
   means for normally biasing the movable member toward the distal end of the predetermined reference axis; and
   a retaining member which removably retains the test pin substantially parallel to the reference axis, the retaining member being integrally mounted on the movable member.

2. A test pin unit as claimed in claim 1, wherein the retaining member comprises a housing part for housing a part of the test pin and at least one screw provided on the side of the housing part, where the test pin is fixed on the housing part by housing the part of the test pin in the housing part and then securing the part of the test pin on the housing part by the screw.

3. A test pin unit as claimed in claim 1, wherein said means for biasing the movable member toward the distal end of the predetermined reference axis comprises a spring.

4. A test pin unit as claimed in claim 2, wherein said means for biasing the movable member toward the distal end of the predetermined reference axis comprises a spring.

5. A test apparatus comprising a plurality of test pin units as claimed in claim 1.

6. A test apparatus comprising a plurality of test pin units as claimed in claim 2.

7. A test pin unit to be used in a test apparatus to test a subject to evaluate electric characteristics of the subject, said test pin unit comprising:
   a substantially straight test pin to be brought into contact with a predetermined test point on the subject;
   a movable member capable of moving within a predetermined distance along a predetermined reference axis;
   means for normally biasing the movable member toward the distal end of the predetermined reference axis; and
   a retaining member which removably retains the test pin substantially parallel to the reference axis, the retaining member being integrally mounted on the movable member.

8. A test pin unit as claimed in claim 7, wherein the retaining member comprises a housing part for housing a part of the test pin and at least one screw provided on the side of the housing part, where the test pin is fixed on the housing part by housing the part of the test pin in the housing part and then securing the part of the test pin on the housing part by the screw.

9. A test pin unit as claimed in claim 7, wherein said means for biasing the movable member toward the distal end of the predetermined reference axis comprises a spring.

10. A test pin unit as claimed in claim 8, wherein said means for biasing the movable member toward the distal end of the predetermined reference axis comprises a spring.

11. A test apparatus comprising a plurality of test pin units as claimed in claim 7.

12. A test apparatus comprising a plurality of test pin units as claimed in claim 8.

* * * * *